(12) United States Patent
Mandal et al.

(10) Patent No.: US 11,601,116 B2
(45) Date of Patent: Mar. 7, 2023

(54) SYSTEM AND METHOD FOR GENERATING SUB HARMONIC LOCKED FREQUENCY DIVISION AND PHASE INTERPOLATION

(71) Applicant: SAMSUNG ELECTRONICS CO., LTD., Suwon-si (KR)

(72) Inventors: Gunjan Mandal, Bangalore (IN); Vishnu Kalyanamahadevi Gopalan Jawarlal, Bangalore (IN)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/307,489

(22) Filed: May 4, 2021

(65) Prior Publication Data

US 2022/0247392 A1 Aug. 4, 2022

(30) Foreign Application Priority Data

Feb. 2, 2021 (IN) .............................. 202141004388

(51) Int. Cl.
*H03K 3/03* (2006.01)
*H03K 5/01* (2006.01)
*H03K 5/00* (2006.01)

(52) U.S. Cl.
CPC ............. *H03K 3/0315* (2013.01); *H03K 5/01* (2013.01); *H03K 2005/00078* (2013.01)

(58) Field of Classification Search
CPC .................................................. H03K 3/0315
(Continued)

(56) References Cited

U.S. PATENT DOCUMENTS 8,674,773 B2 * 3/2014 Nedovic ............... H03L 7/0995
327/159
8,710,929 B1 4/2014 Naviasky et al.
(Continued)

FOREIGN PATENT DOCUMENTS

WO 2011003040 1/2011
WO 2019155582 8/2019

OTHER PUBLICATIONS

Betancourt-Zamora, et al., "1-GHz and 2.8-GHz CMOS Injection-locked Ring Oscillator Prescalers", published in 2001 Symposium on VLSI Circuits, Digest of Technical Papers, Jun. 14-16, 2001, 4 pages.

(Continued)

*Primary Examiner* — Joseph Chang
(74) *Attorney, Agent, or Firm* — F. Chau & Associates, LLC

(57) ABSTRACT

A system for generating a sub-harmonically injection locked phase interpolated output signal. The system comprises ring oscillator (RO) circuitry to generate an output oscillator signal in response to a periodic input signal. The RO circuitry includes a plurality of differential delay RO stages interconnected in cascade within a closed loop, where each RO stage is configured to establish a corresponding delayed version of the output oscillator signal successively shifted in phase by a predetermined phase difference based on a predetermined interpolation mapping scheme. The system further comprises signal injection circuitry coupled to the RO circuitry to apply a first signal having a first input phase and a second signal having a second input phase to the plurality of differential delay RO stages based on the predetermined interpolation mapping scheme to lock a frequency of the output oscillator signal at one half the frequency of the periodic input signal.

20 Claims, 8 Drawing Sheets

(58) Field of Classification Search
USPC .......................................................... 331/57
See application file for complete search history.

(56) References Cited

U.S. PATENT DOCUMENTS

| | | | |
|---|---|---|---|
| 8,810,319 | B1 | 8/2014 | Chan et al. |
| 8,941,420 | B2 | 1/2015 | Zerbe et al. |
| 9,209,821 | B2 | 12/2015 | Bichan et al. |
| 9,397,623 | B1 | 7/2016 | Lacroix |
| 9,444,438 | B2 * | 9/2016 | Depaoli .............. H03B 5/1228 |
| 9,467,313 | B2 | 10/2016 | Bulzacchelli et al. |
| 9,735,989 | B1 | 8/2017 | Xie et al. |
| 9,755,574 | B2 | 9/2017 | Chatwin |
| 10,333,533 | B1 | 6/2019 | Moscone |
| 10,396,807 | B1 * | 8/2019 | Dai ........................... H03L 7/07 |
| 2015/0188554 | A1 | 7/2015 | Chong |
| 2016/0308665 | A1 | 10/2016 | Luo et al. |
| 2018/0375694 | A1 | 12/2018 | Liao et al. |

OTHER PUBLICATIONS

Kreienkamp, et al., "A 10-GB/s CMOS Clock and Data Recovery Circuit With an Analog Phase Interpolator", IEEE Journal of Solid-State Circuits, vol. 40, No. 3, Mar. 2005, pp. 736-743.

Saxena, et al., "A 2.8 mW/GB/s, 14 GB/s Serial Link Transceiver", IEEE Journal of Solid-State Circuits, vol. 52, No. 5, May 2017, pp. 1399-1411.

Extended European Search Report dated Jun. 29, 2022 in corresponding European Patent Application No. 22153737.6 (12 pages).

Siriburanon, et al., "A Low-Power Low-Noise mm-Wave Subsampling PLL Using Dual-Step-Mixing ILFD and Tail-Coupling Quadrature Injection-Locked Oscillator for IEE 802.11ad", IEEE Journal of Solid-State Circuits, vol. 51, No. 5, May 2016; pp. 1246-1260.

Farazian, et al., "Stability and Operation of Injection-Locked Regenerative Frequency Dividers", IEEE Transactions on Circuits and Systems-I: Regular Papers, vol. 57, No. 8, Aug. 2010, pp. 2006-2019.

* cited by examiner

SYSTEM AND METHOD FOR GENERATING SUB HARMONIC LOCKED FREQUENCY DIVISION AND PHASE INTERPOLATION

CROSS REFERENCE TO RELATED APPLICATION

This application is related to and claims priority under 35 U.S.C. 119 to Indian application no. 202141004388, filed in the Indian patent office on Feb. 2, 2021, the content of which is incorporated by reference herein in its entirety.

TECHNICAL FIELD

The present disclosure relates generally to clock generation and more particularly to injection locked phase interpolation techniques for clock generation at a receiving device.

DISCUSSION OF THE RELATED ART

Demodulation and decoding of modulated signals at a receiver may involve generating reference In-phase (I) and Quadrature-phase (Q) signals to achieve precise sampling synchronized with data symbols. One technique for generating such I and Q reference signals, known as a fundamental harmonic injection locked phase interpolation technique, reduces the number of required input phases as compared to mixer based schemes. However, a fundamental harmonic injection locked phase interpolation technique may suffer from a narrow frequency locking range and poor systematic IQ skew.

SUMMARY

This summary is provided to introduce a selection of concepts, in a simplified format, that are further described in the detailed description section. This summary is neither intended to identify key or essential inventive concepts, nor is it intended for determining the scope of the claimed subject matter.

In an example embodiment, a system for generating a sub-harmonically injection locked phase interpolated output signal is disclosed. The system comprises ring oscillator (RO) circuitry to generate an output oscillator signal in response to a periodic input signal. The RO circuitry includes a plurality of differential delay RO stages interconnected in cascade within a closed loop, where each of the plurality of differential delay RO stages is configured to establish a corresponding delayed version of the output oscillator signal successively shifted in phase by a predetermined phase difference based on a predetermined interpolation mapping scheme. The system further comprises signal injection circuitry coupled to the RO circuitry to apply first and second input signals having a first input phase and a second input phase, respectively, to the plurality of differential delay RO stages based on the predetermined interpolation mapping scheme, to lock a frequency of the output oscillator signal at one half the frequency of the periodic input signal.

In another example embodiment, a method for generating sub-harmonically injection locked phase interpolated output signal is disclosed. The method comprises generating an output oscillator signal in response to a periodic input signal injected to a Ring Oscillator (RO), where the RO includes a plurality of differential delay RO stages interconnected in cascade within a closed loop, wherein each of the plurality of differential delay RO stages is configured to establish a corresponding delayed form of the output oscillator signal successively shifted in phase by a predetermined phase difference based on a predetermined interpolation mapping scheme. The method further comprises applying a first signal having a first input phase and a second signal having a second input phase to the plurality of differential delay RO stages based on the predetermined interpolation mapping scheme to lock a frequency of the output oscillator signal at one half the frequency of the periodic input signal.

BRIEF DESCRIPTION OF THE DRAWINGS

These and other features, aspects, and advantages of the present inventive concept will become better understood when the following detailed description is read with reference to the accompanying drawings in which like characters represent like parts throughout the drawings, wherein.

DETAILED DESCRIPTION OF FIGURES

Figure 1:
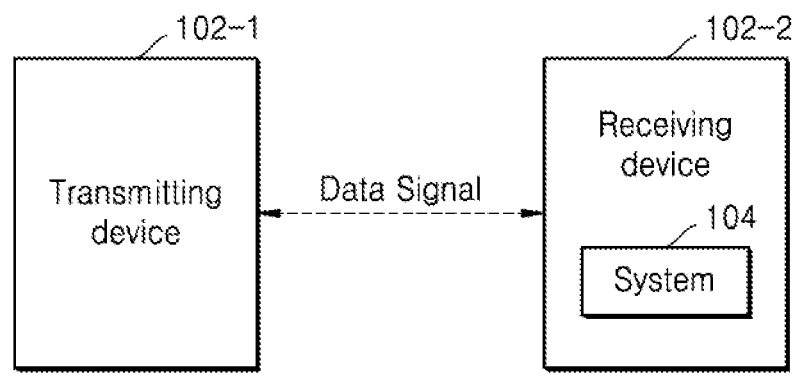
FIG. 1 illustrates a network system including transmitting and receiving devices.

For the purpose of promoting an understanding of the principles of the inventive concept, reference will now be made to embodiments illustrated in the drawings, and specific language will be used to describe the same. It will nevertheless be understood that no limitation of the scope of the inventive concept is thereby intended, such alterations and further modifications in the illustrated system, and such further applications of the principles of the inventive concept as illustrated therein being contemplated as would normally occur to one skilled in the art to which this subject matter relates.

In the following description, a phrase such as "apply a first phase" to another component is intended to mean "apply a signal having a first phase" to that component.

FIG. 1 illustrates a network system 100 implementing a system 104 for a sub-harmonically locked divide-by-2 phase interpolation, according to an embodiment of the present subject matter. Network system 100 may include a transmitting device 102-1 that transmits data signals to a receiving device 102-2. The system 104 may be implemented in receiving device 102-2. In some cases, devices 102 are user devices such as a laptop, a desktop, a smartphone, a tablet, and a desktop computer. If data is also transmitted from device 102-2 to device 102-1, a similar or identical system 104 may be incorporated within device 102-1.

Other examples of the transmitting device 102-1 and receiving device 102-2 include a base station, a portable computing device, a television, or any other computing device. The transmitting device 102-1 and the receiving device 102-2 may be connected to each other via a high speed interface, such as but not limited to M-PHY, High-Definition Multimedia Interface (HDMI), DisplayPort (DP) and Embedded DisplayPort (eDP), Peripheral Component Interconnect Express (PCIe), and, Universal Serial Bus (USB).

The receiving device 102-2 receives the data signal from the transmitting device 102-1, where the data signal may be a digital signal or an analog signal. The system 104 may be configured to receive the data, detect a phase shift in data, and shift a phase of an input periodic signal, e.g., a reference signal. In this manner, the reference signal may be synchronized with the data signal, whereby sampling may occur at a central time point within a data symbol interval of the data signal. In particular, the system 104 may perform frequency division and interpolation based on a predetermined mapping scheme, such that an obtained output frequency is one half of an injected signal frequency. Examples of components and operations of system 104 are described hereafter in connection with FIGS. 2-4.

Figure 2:
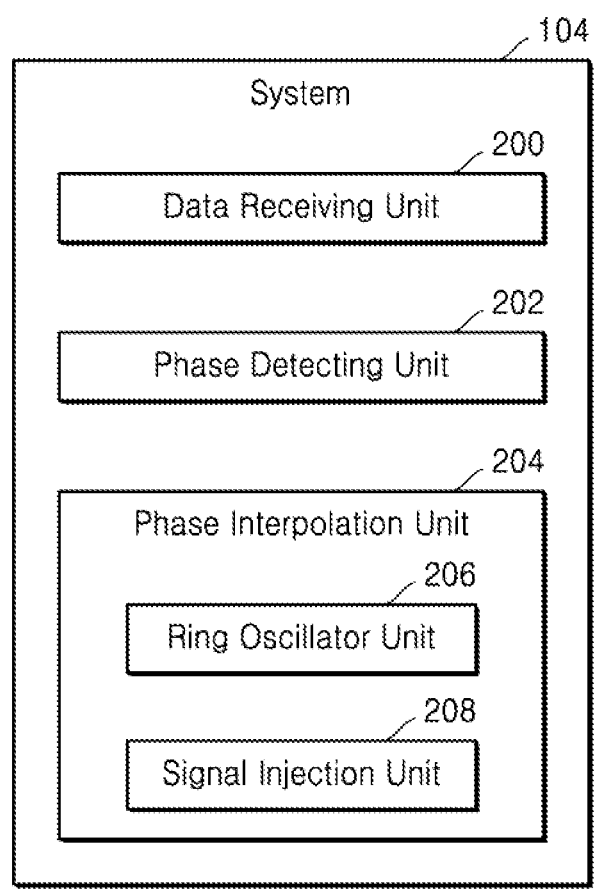
FIG. 2 illustrates a schematic block diagram of a system within a receiving device, according to an embodiment.

FIG. 2 illustrates a schematic block diagram of the system 104, according to an embodiment of the present subject matter. As shown in the figure, the system 104 includes a data receiving unit 200, a phase detecting unit 202, and a phase interpolation unit 204. The data receiving unit 200 may be configured to receive data, for example, the data signal, that is transmitted by the transmitting device 102-1 to the receiving device 102-2. Upon receiving the data, the phase detecting unit 202 may be configured to analyze the data and determine the presence of any jitter that may be introduced in the data. More particularly, in an example, the phase detection unit 202 may be configured to determine any shift in phase of the received data signal. Accordingly, based on the determinations made by the phase detecting unit 202, the phase interpolation unit 204 may be configured to perform an operation of sub-harmonically injecting phase interpolation. To this end, the phase interpolation unit 204 may be configured to output a signal at a frequency one half of the injected signal frequency, and inject differential phases simultaneously to each of multiple stages of a Ring Oscillator (RO) based on a predetermined interpolation mapping scheme. To that end, in an example embodiment, the phase interpolation unit 204 comprises a Ring Oscillator (RO) unit 206 and a signal injection unit 208. Operational details and functions of the RO unit 206 and the signal injection unit 208 are described in detail with reference to FIG. 3. It is noted here that the units 200-208 are each configured with circuitry and may be interchangeably referred to as data receiving circuitry 200, phase detecting circuitry 202, . . . , signal injecting circuitry 208.

Figure 3:
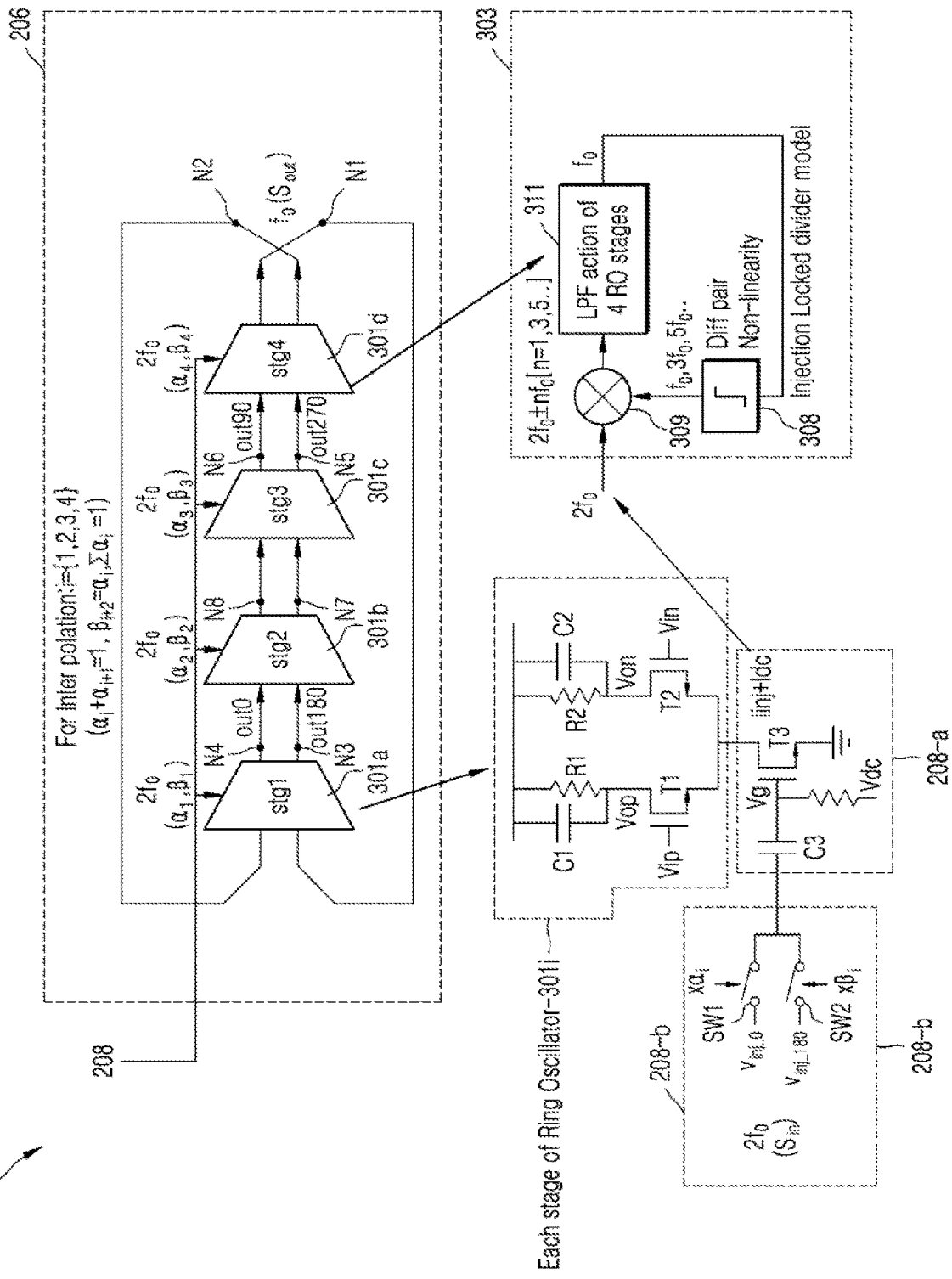
FIG. 3 illustrates an example frequency locking and phase interpolation unit, where the frequency of output signal is one half the frequency of an injected input signal according to an embodiment of the present subject matter.

FIG. 3 illustrates example details of the components of the phase interpolation unit 204, according to an embodiment. The RO unit (circuitry) 206 may include a plurality of differential delay RO stages 301a, 301b, 301c, and 301d, hereinafter collectively referred to as "RO stages 301". In an example, the plurality of differential delay RO stages 301 are interconnected in cascade within a closed loop.

Each of the RO stages 301 may be configured to establish a corresponding delayed version of an output oscillator signal that is successively shifted in phase by a predetermined phase difference. Herein, the predetermined phase difference is based on a predetermined interpolation mapping scheme. The predetermined mapping scheme may be understood as a mapping that indicates a relation amongst first normalized injected weights corresponding to a first input phase applied to each of the RO stages 301, and second normalized injected weights corresponding to a second input phase applied to each of the RO stages 301, and a number of interpolation steps provided between adjacent RO stages. Details of the predetermined mapping scheme is provided in FIG. 4.

In an example embodiment, the first differential delay RO stage 301a and each RO stage in the cascade two stages thereafter (just RO stage 301c in the example of FIG. 3) generate differential In-phase (I) and Quadrature (Q) signal references corresponding to an output periodic signal. The output periodic signal is generated from an input signal based on the predetermined interpolation mapping scheme. In an example, when the periodic signal's polar representation is translated onto a two-dimensional Cartesian coordinate system, the same phasor may be defined in terms of horizontal X and vertical Y coordinates with respect to a center point of origin. The horizontal X-axis is defined as the In-phase reference (I reference) and the vertical Y axis is defined as the Quadrature (Q) reference. Further, consider the stage 301a to be the first differential delay RO stage. Now, according to aspects of the present subject matter, the stage 301a and the stage two stages thereafter, i.e., stage 301c, generate differential I and Q signal references corresponding to the output periodic signal. As mentioned above, the output periodic signal is generated based on the periodic input signal using the predetermined interpolation mapping scheme. In the example embodiment, the output periodic signal has a frequency half of a frequency of the periodic input signal. Furthermore, a quadrature relation exists between the two output signal references I and Q. In other words, if I is 0°, then Q would be 90°.

Further shown in FIG. 3 is an operation scheme 303 depicting operation of the RO unit 206. In an example, the RO unit 206 divides the frequency of the periodic input signal in half. For instance, when the periodic input signal is injected at a current source, a mixing operation denoted by mixer 309 with generated odd harmonics from previous RO stage as denoted by function 308 is performed at each RO stage 301i (i=any integer), and that creates odd harmonics at the output (where the odd harmonics are understood to include a sub-harmonic $f_o$). Further, the odd harmonics are fed to a low pass filter 311 (realized by the cascade of RO stages 301) and only the lowest frequency among them (the sub-harmonic $f_o$) will pass. In an exemplary scenario, a periodic signal having frequency $2f_o$ is injected and odd harmonics, i.e. $f_o$, $3f_o$, $5f_o$ . . . are created. These odd harmonics are fed to the low pass filter 311 which passes the frequency $f_o$, which is lowest among all the odd harmonics and is one half of the injected input frequency $2f_o$.

In an example embodiment, the signal injection unit 208 is coupled to the RO unit 206 and may be configured to apply a first input phase $V_{inj\_0}$ and a second input phase $V_{inj\_180}$ to each of the RO stages 301. (As noted earlier, the phrase "applying a phase" is used for brevity to mean "applying a signal having a phase". Furthermore, the application of the phase has been shown as a line connecting signal injection unit 208 to each of the stages 301.) The first input phase Vinj_0 is hereinafter interchangeably referred to as "the first input phase" and the second input phase $V_{inj\_180}$ is hereinafter interchangeably referred to as "the second input phase". The first and second input phases may each be referred to as a periodic input signal $S_{IN}$, which has a frequency $2f_0$. An output signal $S_{OUT}$ at frequency $f_0$ may be generated and taken out from any two alternating stages. For example, the output signal may be taken from output nodes N1 and N2 of stage 301d, and output nodes N7 and N8 of stage 301b, of the RO unit 206. Furthermore, output reference signals may also be taken at nodes N3 and N4, or at nodes N5 and N6 of the RO unit 206.

The first and second input phases are applied to the tail current sources (that is, as a voltage Vg at the gate of a transistor T3) of each of the stages 301a, 301b, 301c, 301d, of the RO unit 206. In an example, the first input phase $V_{inj\_0}$ and the second input phase $V_{inj\_180}$ are offset from each other by 180°. Thus, if the first input phase $V_{inj\_0}$ is 0°, then the second input phase $V_{inj\_180}$ is 180°. The signal injection unit 208 may be configured to apply the first input phase and the second input phase simultaneously to consecutive pairs of adjacent differential delay RO stages among the differential delay RO stages 301. In other words, the signal injection unit 208 applies the first input phase to the stage 301a and 301b, and applies the second input phase to the stage 301c and 301d. Switches SW1 and SW2, which may be coupled to the gate of transistor T3 through a capacitor C3, may be suitably controlled within each RO stage 301 to apply the desired first or second input phase to the gate of T3. A drain of transistor T3 may be tied to a source of each transistor T1 and T2 of a differential pair. A parallel arrangement of a resistor R1 and a capacitor C1 may be tied to the drain of transistor T1, and a parallel arrangement of a resistor R2 and a capacitor C2 may be tied to the drain of transistor T2. A positive polarity voltage Vip may be applied to the gate of T1, and a negative polarity voltage Vin may be applied to the gate of transistor T2. The source of T3 may be tied to ground. A current $I_{inj}+I_{dc}$ may flow across transistor T3. Where $I_{inj}$ is current generated in T3 due to injected signal (that is the first input phase and the second input phase) and $I_{dc}$ is the quiescent current generated in T3 during no signal injection.

In an example, the signal injection unit 208 may include a current generating circuitry, depicted as 208-a, including a plurality of current sources, for example, T3, such that a current source is coupled with a differential delay RO stage. Each current source is actuated to generate a plurality of current signals corresponding to the frequency of the periodic input signal $S_{IN}$, the first input phase and the second input phase. The signal injection unit 208 may further include an injection clock circuitry, depicted as 208-b, that may be coupled to the current generating circuitry 208-a. The injection clock circuitry 208-b includes a plurality of switching devices SW1, SW2 actuated responsive to the periodic input signal SIN to couple the plurality of current signals to corresponding RO stages 301.

In an exemplary case, the first input phase $V_{inj\_0}$ is injected to stage 1 and stage 2 (301a and 301b), and the second input phase $V_{inj\_180}$ is injected to stage 3 and stage 4 (301c and 301d) with different values of $\alpha_1$, $\beta_1$, $\alpha_2$, $\beta_2$, $\alpha_3$, $\beta_3$, and $\alpha_4$, $\beta_4$, respectively. The first normalized injected weight is the coefficient α and the second normalized injected weight is the coefficient β. The injection of the first input phase and the second input phase into the different RO stages may be symmetric with respect to outputs (I and Q) which are in quadrature in terms of phase relation. In other words, I and Q have a phase relation of 90°. Because of the frequency division, the first and second phases can be injected to alternate pairs of stages of the RO unit 206 simultaneously, and each stage of RO unit 206 may always provide a phase difference of 45 degrees.

Figure 4:
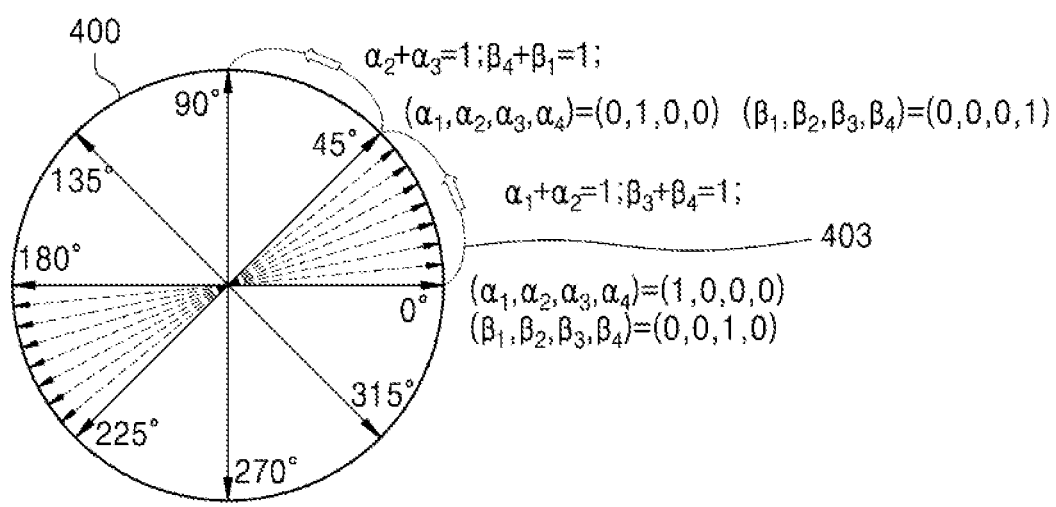
FIG. 4 illustrates a phase mapping scheme for phase interpolation according to an embodiment of the present subject matter.

FIG. 4 illustrates an example phase interpolation mapping scheme. The interpolation mapping scheme may indicate a relation amongst the first normalized injected weights corresponding to the first input phase applied to each of the RO stages 301 and the second normalized injected weights corresponding to the second input phase applied to each of the RO stages 301, and a number of steps of interpolation achieved between each pair of adjacent differential delay RO stages 301.

In an example, a sum of first normalized injected weights that are applied to adjacent differential delay RO stages is one. For instance, as depicted below in equation below sum of $\alpha_i+\alpha_{i+1}$ is 1. In an example, a sum of second normalized injected weights that are applied to each of the plurality of differential delay RO stages is one. In an example, the first normalized injected weight (α) is equated to the second normalized injected weight (β) using the relation $\beta_{i+2}=\alpha_i$, also depicted below.

According to an example embodiment, the following equations define the mapping scheme for phase interpolation and relation between the coefficients α and β:

$$\beta_{i+2}=\alpha_i, \Sigma\alpha_i=1, \alpha_i+\alpha_{i+1}=1 \qquad \text{eq (1)}$$

Where, $\alpha_i$ is normalized injected strength of Vinj_0 at stage i, $\beta_i$ is normalized injected strength of Vinj_180 at stage i, and i={1, 2, 3, 4}.

In an example, for N steps of interpolation between adjacent stages, the following equations may be used:

$$\alpha_i=\{1,(N-1)/N,(N-2)/N,\ldots,2/N,1/N,0\}, \alpha_{i+1}=\{0,1/N,2/N,\ldots,(N-1)/N,1\} \qquad \text{eq (2)}$$

The example of FIG. 4 illustrates interpolation between adjacent stages with a value of N=8. In other embodiments, the value of N can be set other than 8 based on a number of interpolation between stages. For interpolation according to eq (2), the adjacent RO stages take values in sets, for example: $\alpha_i=1$, $\alpha_{i+1}=0$; next: $\alpha_i=(N-1)/N$, $\alpha_i+1=1/N$; and so on. Finally: $\alpha_i$ becomes 0 and $\alpha_i+1$ becomes 1 at the completion of first phase rotation.

As illustrated in FIG. 4, interpolation between adjacent stages with the same input phase injected covers 45° of output phase rotation. Further, in an example, by rotating the input phases through four stages in cyclic manner two times, a complete 360° phase interpolation of output phase is achieved. In FIG. 4, the legend 400 represents the complete 360° phase interpolation of output phase, 403 represents that interpolation between adjacent stages with the same input phase injected covers 45° of output phase rotation. Further, dotted lines between 0 degrees and 45 degrees represents interpolation between adjacent stages with N steps. At 0 degrees, the values of α and β are calculated based on the equation 1 considering the value of i is 1. Accordingly, at 0 degrees, values are $(\alpha_1, \alpha_2, \alpha_3, \alpha_4)=(1, 0, 0, 0)$; and $(\beta_1, \beta_2, \beta_3, \beta_4)=(0, 0, 1, 0)$.

For the first phase rotation, e.g., from 0 degrees to 45 degrees, while i=1, the following relation holds true: $\alpha_1+\alpha_2=1$; and $\beta_3+\beta_4=1$. Further, upon completing a 45 degree phase rotation, e.g., rotation from 0 degree to 45 degree, the values $\alpha_i$ and $\alpha_{i+1}$ may be changed in accordance with the equation 2 and accordingly, at 45 degrees, values are $(\alpha_1, \alpha_2, \alpha_3, \alpha_4)=(0, 1, 0, 0)$; and $(\beta_1, \beta_2, \beta_3, \beta_4)=(0, 0, 0, 1)$.

In a similar manner, for the second phase rotation, e.g., from 45 degrees to 90 degrees, while i=2, the following relation holds true: $\alpha_2+\alpha_3=1$; and $\beta_4+\beta_1=1$, when i becomes higher than 4, it rotates in the loop cyclic manner and comes back to 1,2,3,4. Further, upon completing another 45 degree phase rotation, e.g., rotation from 45 degree to 90 degree, the values $\alpha_i$ and $\alpha_{i+1}$ may be changed in accordance with the equation 2 and accordingly, at 90 degrees, values are $(\alpha_1, \alpha_2, \alpha_3, \alpha_4)=(0, 0, 1, 0)$; and $(\beta_1, \beta_2, \beta_3, \beta_4)=(1, 0, 0, 0)$.

In a similar manner, for the third phase rotation i.e. from 90 degrees to 135 degrees, while i=3, the following relation holds true: $\alpha_3+\alpha_4=1$; and $\beta_1+\beta_2=1$, when i becomes higher than 4, it rotates in the loop cyclic manner and comes back to 1,2,3,4. Further, upon completing another 45 degree phase rotation, e.g., rotation from 90 degrees to 135 degrees, the values $\alpha_i$ and $\alpha_{i+1}$ will be changed in accordance with the equation 2 and accordingly, at 135 degrees, values are $(\alpha_1, \alpha_2, \alpha_3, \alpha_4)=(0, 0, 0, 1)$; and $\beta_1, \beta_2, \beta_3, \beta_4)=(0, 1, 0, 0)$.

In a similar manner, for the fourth phase rotation, e.g., from 135 degrees to 180 degrees, while i=4, the following relation holds true: $\alpha_4+\alpha_1=1$; and $\beta_2+\beta_3=1$, when i becomes higher than 4, it rotates in the loop cyclic manner and comes back to 1,2,3,4. Further, upon completing another 45 degree phase rotation, e.g., rotation from 135 degrees to 180 degrees, the values $\alpha_i$ and $\alpha_{i+1}$ may be changed in accordance with the equation 2 and accordingly, at 180 degree values are $(\alpha_1, \alpha_2, \alpha_3, \alpha_4)=(1, 0, 0, 0)$; and $\beta_1, \beta_2, \beta_3, \beta_4)=(0, 0, 1, 0)$.

In a similar manner, for the fifth phase rotation, e.g., from 180 degrees to 225 degrees, while i=1 (rotated in the cyclic manner), the following relation holds true: $\alpha_1+\alpha_2=1$; and $\beta_3+\beta_4=1$, when i becomes higher than 4, it rotates in the loop cyclic manner and comes back to 1,2,3,4. Further, upon completing another 45 degree phase rotation, e.g., rotation from 180 degrees to 225 degrees, the values $\alpha_i$ and $\alpha_{i+1}$ will be changed in accordance with the equation 2 and accordingly, at 225 degree values are $(\alpha_1, \alpha_2, \alpha_3, \alpha_4)=(0, 1, 0, 0)$; and $(\beta_1, \beta_2, \beta_3, \beta_4)=(0, 0, 0, 1)$.

In a similar manner, for the sixth phase rotation, e.g., from 225 degree to 270 degree, while i=2, the following relation holds true: $\alpha_2+\alpha_3=1$; and $\beta_4+\beta_1=1$, when i becomes higher than 4, it rotates in the loop cyclic manner and comes back to 1,2,3,4. Further, upon completing another 45 degree phase rotation i.e. rotation from 225 degree to 270 degree, the values $\alpha_i$ and $\alpha_{i+1}$ will be changed in accordance with the equation 2 and accordingly, at 270 degree values are $(\alpha_1, \alpha_2, \alpha_3, \alpha_4)=(0, 0, 1, 0)$; and $(\beta_1, \beta_2, \beta_3, \beta_4)=(1, 0, 0, 0)$.

In a similar manner, for the seventh phase rotation i.e. from 270 degree to 315 degree, while i=3, the following relation holds true: $\alpha_3+\alpha_4=1$; and $\beta_1+\beta_2=1$, when i becomes higher than 4, it rotates in the loop cyclic manner and comes back to 1,2,3,4. Further, upon completing another 45 degree phase rotation i.e. rotation from 270 degree to 315 degree, the values $\alpha_i$ and $\alpha_{i+1}$ will be changed in accordance with the equation 2 and accordingly, at 315 degree values are $(\alpha_1, \alpha_2, \alpha_3, \alpha_4)=(0, 0, 0, 1)$; and $(\beta_1, \beta_2, \beta_3, \beta_4)=(0, 1, 0, 0)$.

In a similar manner, for the eight phase rotation i.e. from 315 degree to 0 degree, while i=4, the following relation holds true: $\alpha_4+\alpha_1=1$; and $\beta_2+\beta_3=1$. Further, upon completing another 45 degree phase rotation i.e. rotation from 315 degree to 0 degree, the values $\alpha_i$ and $\alpha_{i+1}$ will be changed in accordance with the equation 2 and accordingly, at 0 degree values are $(\alpha_1, \alpha_2, \alpha_3, \alpha_4)=(1, 0, 0, 0)$; and $(\beta_1, \beta_2, \beta_3, \beta_4)=(0, 0, 1, 0)$.

In this exemplary interpolation scheme, the input signals are injected to all stages simultaneously and symmetrically compared to single phase fundamental injection locked RO where input is injected only to a single stage. Hence the achieved systematic IQ skew is minimized and an achieved frequency locking range for given injection ratio $(I_{inj}/I_{dc})$ is higher than that of a single stage fundamental injection locked RO, where $I_{inj}$ is the strength of injected current and $I_{dc}$ is dc operating value of bias current without any signal injection.

Figure 5:
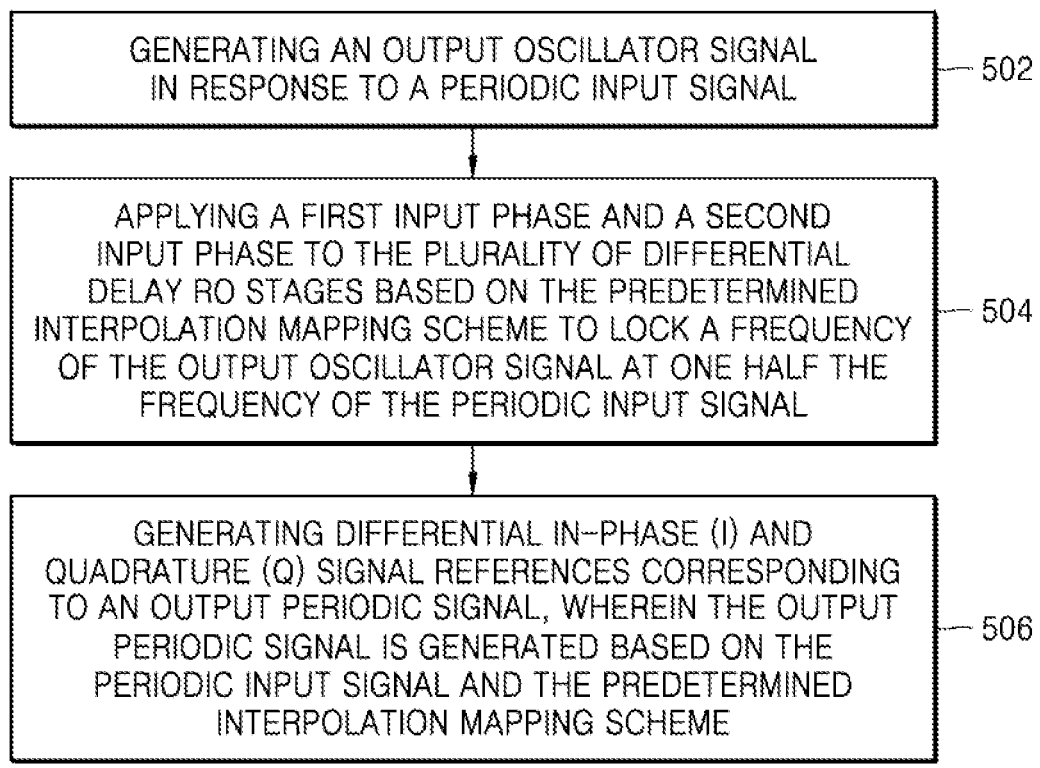
FIG. 5 illustrates a method for generating sub-harmonically injection locked phase interpolated output signal, according to one or more embodiments of the present subject matter.

FIG. 5 illustrates an example method 500 for generating a sub-harmonically injection locked phase interpolated output signal. The method 500 may be implemented using one or more components of the system 104. For the sake of brevity, details of the present disclosure that have been explained in detail with reference to the description of FIGS. 3 and 4 above are not explained in detail in the following description.

At step 502, an output oscillator signal is generated in response to a periodic input signal. Herein, the periodic input signal is applied to a RO unit, such as the RO unit 206, where the RO unit including a plurality of differential delay RO stages interconnected in cascade within a closed loop. In an example, each of the plurality of differential delay RO stages is configured to establish a corresponding delayed version of the output oscillator signal that is successively shifted in phase by a predetermined phase difference based on a predetermined interpolation mapping scheme. The predetermined interpolation mapping scheme indicates a relation amongst a first normalized injected weight corresponding to the first input phase applied to each of the plurality of differential delay RO stages, a second normalized injected weight corresponding to the second input phase applied to each of the plurality of differential delay RO stages, and number of steps of interpolation achieved between each adjacent differential delay RO stages. In an example, the RO unit 206 may generate the output oscillator signal in response to the periodic input signal.

The value of the first normalized injected weight and a value of the second normalized injected weight can be any value between 1 and 0 and is in accordance with the above defined equation 2.

The first normalized injected weight corresponding to the first input phase applied to each alternate differential delay RO stage is same the second normalized injected weight corresponding to the second input phase applied to each alternate differential delay RO stage. For example If value of I is initiated from 1 then $\alpha_1=\beta_3$, $\alpha_2=\beta_4$, $\alpha_3=\beta_1$, $\alpha_4=\beta_2$.

At step 504, a first input phase and a second input phase are applied to the plurality of differential delay RO stages based on the predetermined interpolation mapping scheme to lock a frequency of the output oscillator signal at one half the frequency of the periodic input signal. The step of applying the first input phase and the second input phase comprises applying the first input phase and the second input phase simultaneously to consecutive pairs of adjacent differential delay RO stages from the plurality of differential delay RO stages, where the first input phase and the second input phase are in a relation of 180-degree. In an example, the signal injection unit 208 may the apply first input phase and the second input phase to the plurality of differential delay RO stages.

At step 506, differential In-phase (I) and Quadrature (Q) signal references corresponding to an output periodic signal are generated, where the output periodic signal is generated based on input periodic signal and the predetermined interpolation mapping scheme. The differential I and Q may be generated at alternate differential delay RO stages. For instance, at a first differential delay RO stage and at every other differential delay RO stage thereafter. Herein, the In-phase (I) and Quadrature (Q) signal references have a quadrature phase relation of 90 degree, and the output periodic signal has a frequency that is half of the frequency of the periodic input signal. In an example, the RO unit 206 may generate the differential In-phase (I) and Quadrature (Q) signal references.

The method 500 further comprises a step of generating an intermediate output oscillator signal at each consecutive pair of adjacent differential delay RO stages based on differential In-phase (I) and Quadrature (Q) signal references corresponding to the output periodic signal, the first input phase, the second input phase, the periodic input signal, and the predetermined interpolation mapping scheme. Further, the generation of the output oscillator signal is based on low pass filtering of the intermediate output oscillator signal. In an example, the RO unit 206 may generate an oscillator signal at each stage and every other stage provides output with I and Q relation.

Figure 6:
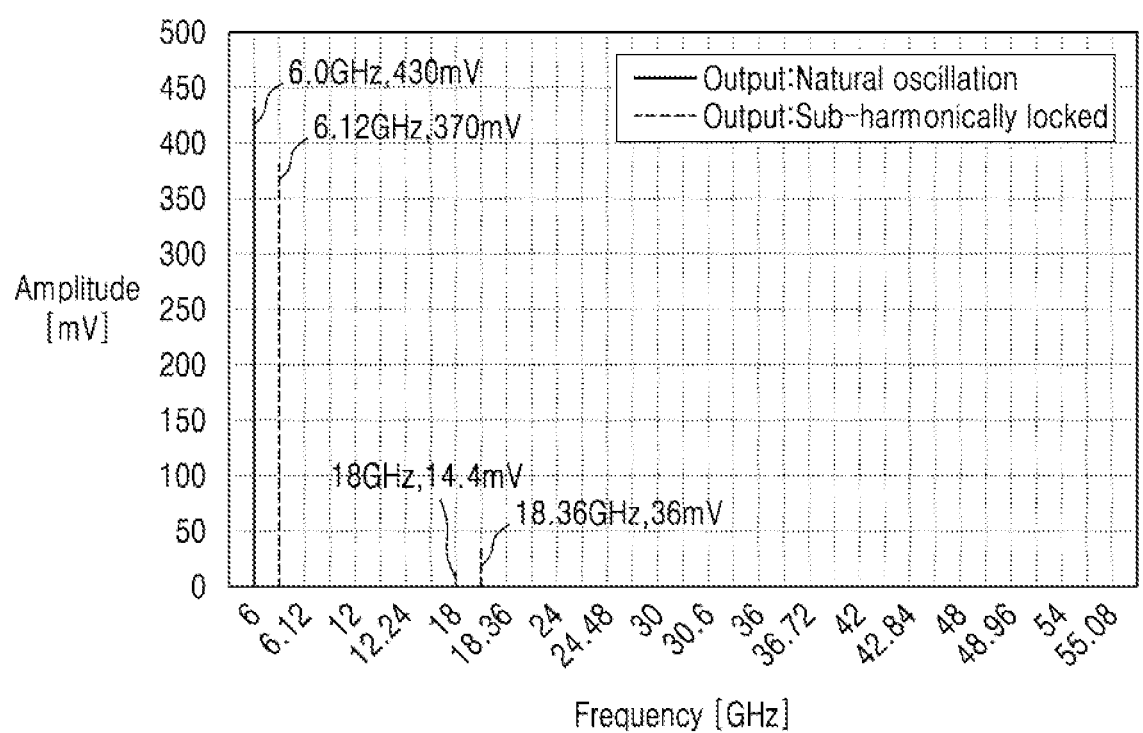
FIG. 6 illustrates the frequency spectrum of the output with injection (sub harmonically locked) and without injection (natural oscillation)

FIG. 6 illustrates a diagram 600 of a simulation result and depicts a comparison between frequency spectrum of the output with proposed solution and with natural oscillation of RO unit. FIG. 6 illustrates that when a signal of 12 GHz is applied and when sub harmonically locked, output frequency locks to 6 GHz from natural oscillation frequency of 6.12 GHz. With sub harmonic injection, power at the fundamental harmonic at the output increases by about 20%, and third harmonic power is reduced by 50%.

Figure 7:
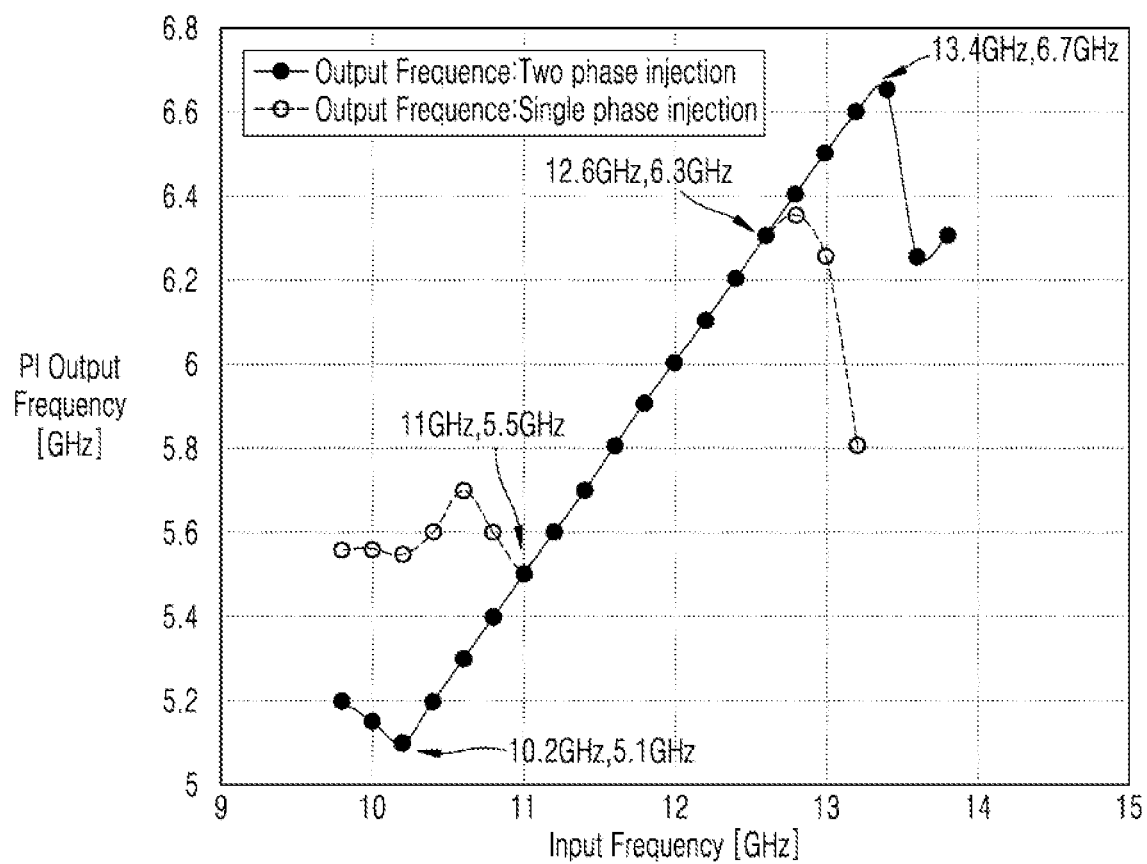
FIG. 7 illustrates a frequency locking range comparison between an existing system and a system according to embodiments herein.

FIG. 7 illustrates a diagram 700 of a simulation result and depicts the frequency locking range comparison between an existing method and a method according to the inventive concept, with the same applied Injection ratio. The dotted curve illustrates the frequency locking range achieved by the single phase injection locking techniques and the solid curve illustrates the frequency locking range achieved by the proposed system 104 and method 500. Injected signal frequency is swept in the range 9.5 to 14 GHz and output frequency is checked. If output frequency is equal to input frequency/2, it is considered to be in locked state. The locking range of the single phase injection locking techniques, in an exemplary scenario, is 5.5 GHz to 6.6 GHz whereas the locking range of the disclosed system 104 is 5.1 GHz to 6.7 GHz, compared to existing methods, proposed solution increases frequency locking range by 100%.

Figure 8:
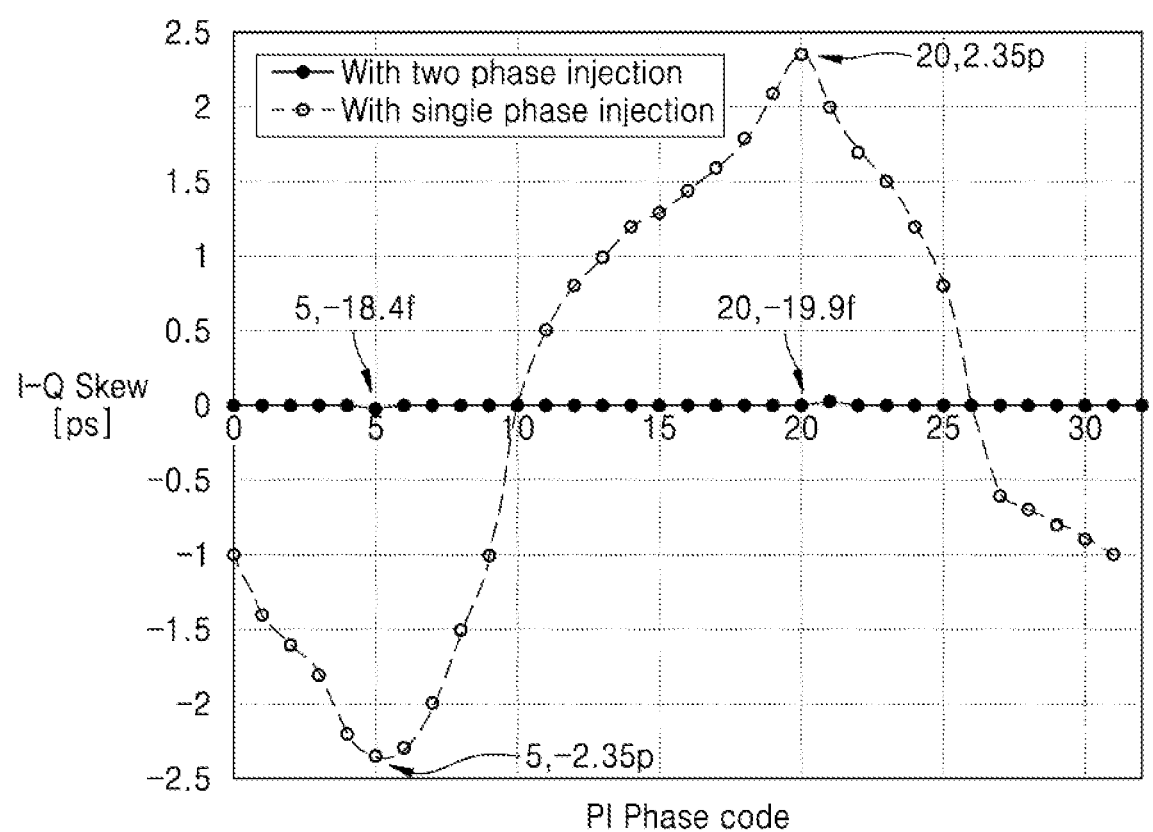
FIG. 8 illustrates an IQ skew comparison between an existing system and a system according to embodiments herein.

FIG. 8 illustrates a diagram 800 of a simulation result and depicts IQ Skew comparison between existing and proposed method. The dotted curve illustrates the IQ skew achieved by the single phase injection locking techniques and the solid curve illustrates the IQ skew achieved by the disclosed system 104 and method 500. The phase interpolator codes are swept to cover phase range of 0 to 180 degrees, this corresponds to 32 codes. Ideally, the spacing between I and Q phases is defined to be 90 degrees at the output frequency. Any deviation from this ideal value is defined as the IQ skew. FIG. 8 illustrates that systematic IQ skew with the proposed solution is 10× better than existing methods. This improvement in IQ skew is possible because of the novel simultaneous and symmetric phase injection scheme.

While specific language has been used to describe embodiments of the present disclosure, any limitations arising on account thereto, are not intended. As would be apparent to a person in the art, various working modifications may be made to the method to implement the inventive concept as taught herein. The drawings and the forgoing description give examples of embodiments. Those skilled in the art will appreciate that one or more of the described elements may well be combined into a single functional element. Alternatively, certain elements may be split into multiple functional elements. Elements from one embodiment may be added to another embodiment.

We claim:

1. A system for generating a sub-harmonically injection locked phase interpolated output signal, the system comprising:
    ring oscillator (RO) circuitry to generate an output oscillator signal in response to a periodic input signal, the RO circuitry including a plurality of differential delay RO stages interconnected in cascade within a closed loop, wherein each of the plurality of differential delay RO stages is configured to establish a corresponding delayed version of the output oscillator signal successively shifted in phase by a predetermined phase difference based on a predetermined interpolation mapping scheme; and
    signal injection circuitry coupled to the RO circuitry, to apply a first signal having a first input phase and a second signal having a second input phase offset from the first input phase to the plurality of differential delay RO stages based on the predetermined interpolation mapping scheme to lock a frequency of the output oscillator signal at one half of a frequency of the periodic input signal.

2. The system of claim 1, wherein a first differential delay RO stage and every other subsequent differential delay RO stage in the cascade generate differential In-phase (I) and Quadrature (Q) signal references corresponding to an output periodic signal, wherein the output periodic signal is generated based on the periodic input signal and the predetermined interpolation mapping scheme, and wherein the output periodic signal has a frequency half of a frequency of the periodic input signal.

3. The system of claim 1, wherein the first and second signals are applied simultaneously to consecutive pairs of adjacent differential delay RO stages among the plurality of differential delay RO stages.

4. The system of claim 3, wherein the first input phase and the second input phase are offset in phase from one another by 180 degrees.

5. The system of claim 3, wherein the predetermined interpolation mapping scheme indicates a relation amongst a first normalized injected weight corresponding to the first input phase applied to each of the plurality of differential delay RO stages, a second normalized injected weight corresponding to the second input phase applied to each of the plurality of differential delay RO stages, and number of steps of interpolation achieved between each adjacent differential delay RO stages.

6. The system of claim 5, wherein a value of the first normalized injected weight and a value of the second normalized injected weight is selected from one of a zero and one based on:
    a sum of the first normalized injected weight corresponding to the first input phase applied to adjacent differential delay RO stages is one;
    a sum of the second normalized injected weight corresponding to the second input phase applied to each of the plurality of differential delay RO stages is one;
    the first normalized injected weight corresponding to the first input phase applied to each alternate differential delay RO stage is same the second normalized injected weight corresponding to the second input phase applied to each alternate differential delay RO stage.

7. The system of claim 5, wherein the interpolation between each adjacent differential delay RO stages achieves the predetermined phase difference and the number of steps of interpolation achieved between each adjacent differential delay RO stages obtain a complete phase interpolation of the periodic input signal at the output of oscillator.

8. The system of claim 3, wherein each consecutive pair of adjacent differential delay RO stages generates an intermediate output oscillator signal based on differential In-phase (I) and Quadrature (Q) signal references corresponding to the output periodic signal, the first input phase, the second input phase, the periodic input signal, and the predetermined interpolation mapping scheme.

9. The system of claim 8, wherein each of differential delay RO stages includes a low pass filter to generate the output oscillator signal based on from the intermediate output oscillator signal.

10. The system of claim 3, wherein the signal injection circuitry includes:
   current generating circuitry comprising of a plurality of current sources such that a current source is coupled with a differential delay RO stage and each current source is actuated to generate a plurality of current signals corresponding to the frequency of the periodic input signal, the first input phase, and the second input phase; and
   injection clock circuitry coupled to the current generating circuitry, the injection clock circuitry including a plurality of switching devices actuated responsive to the periodic input signal to couple the plurality of current signals to corresponding differential delay RO stages.

11. A method for generating a sub-harmonically injection locked phase interpolated output signal, the method comprising:
   generating an output oscillator signal in response to a periodic input signal, using a plurality of differential delay RO stages interconnected in cascade within a closed loop, wherein each of the plurality of differential delay RO stages is configured to establish a corresponding delayed form of the output oscillator signal successively shifted in phase by a predetermined phase difference based on a predetermined interpolation mapping scheme; and
   applying a first signal having a first input phase and a second signal having a second input phase offset from the first input phase to the plurality of differential delay RO stages based on the predetermined interpolation mapping scheme to lock a frequency of the output oscillator signal at one half of a frequency of the periodic input signal.

12. The method of claim 11, comprising generating differential In-phase (I) and Quadrature (Q) signal references corresponding to an output periodic signal, wherein the output periodic signal is generated based on the periodic input signal and the predetermined interpolation mapping scheme at a first differential delay RO stage and at every other one of the differential delay RO stages in the cascade, wherein the output periodic signal has a frequency half of a frequency of the periodic input signal.

13. The method of claim 11, wherein applying the first and second signals comprises applying the first and second signals simultaneously to consecutive pairs of adjacent differential delay RO stages among the plurality of differential delay RO stages.

14. The method of claim 13, wherein the first input phase and the second input phase are offset in phase from each other by 180 degrees.

15. The method of claim 13, wherein the predetermined interpolation mapping scheme indicates a relation amongst a first normalized injected weight corresponding to the first input phase applied to each of the plurality of differential delay RO stages, a second normalized injected weight corresponding to the second input phase applied to each of the plurality of differential delay RO stages, and number of steps of interpolation provided between each adjacent differential delay RO stages.

16. The method of claim 15, wherein a value of the first normalized injected weight and a value of the second normalized injected weight is selected from one of a zero and one based on:
   a sum of the first normalized injected weight corresponding to the first input phase applied to adjacent differential delay RO stages is one;
   a sum of the second normalized injected weight corresponding to the second input phase applied to each of the plurality of differential delay RO stages is one;
   the first normalized injected weight corresponding to the first input phase applied to each alternate differential delay RO stage is same the second normalized injected weight corresponding to the second input phase applied to each alternate differential delay RO stage.

17. The method of claim 15, wherein the interpolation between each adjacent differential delay RO stages achieves the predetermined phase difference and the number of steps of interpolation achieved between each adjacent differential delay RO stages obtain a complete phase interpolation of the periodic input signal at the output of the oscillator.

18. The method of claim 13, wherein generating an intermediate output oscillator signal at each consecutive pairs of adjacent differential delay RO stages based on differential In-phase (I) and Quadrature (Q) signal references corresponding to the output periodic signal, the first input phase, the second input phase, the periodic input signal, and the predetermined interpolation mapping scheme.

19. The method of claim 18, comprises generate the output oscillator signal based on low pass filtering of the intermediate output oscillator signal.

20. The method of claim 13, further comprising:
   generating a plurality of current signals corresponding to the frequency of the periodic input signal, the first input phase, and the second input phase; and
   coupling the plurality of current signals to corresponding differential delay RO stages in response to the periodic input signal.

* * * * *